US006025247A

United States Patent [19]
Chang et al.

[11] Patent Number: 6,025,247
[45] Date of Patent: Feb. 15, 2000

[54] METHOD FOR MANUFACTURING CAPACITOR STRUCTURE OF DYNAMIC MEMORY CELL

[75] Inventors: Julian Y. Chang, Taipei Hsien; Da-Zen Chuang, Taipei, both of Taiwan

[73] Assignee: Nanya Technology Corporation, Taiwan

[21] Appl. No.: 08/868,487

[22] Filed: Jun. 3, 1997

[30] Foreign Application Priority Data

Sep. 24, 1996 [TW] Taiwan ................................. 85111561

[51] Int. Cl.[7] ............................................. H01L 21/8242
[52] U.S. Cl. .......................... 438/396; 438/253; 438/254; 438/255; 438/397; 438/398
[58] Field of Search .................................. 438/253, 396, 438/255, 254, 398, 397; 257/306, 310

[56] References Cited

U.S. PATENT DOCUMENTS

| | | | |
|---|---|---|---|
| 5,392,189 | 2/1995 | Fazan et al. | 257/310 |
| 5,488,011 | 1/1996 | Figura et al. | 438/396 |
| 5,668,038 | 9/1997 | Huang et al. | 438/396 |
| 5,789,289 | 8/1998 | Jeng | 438/396 |
| 5,904,521 | 5/1999 | Jeng et al. | 438/253 |

*Primary Examiner*—Carl Whitehead, Jr.
*Assistant Examiner*—Toniae M. Thomas
*Attorney, Agent, or Firm*—Madson & Metcalf

[57] ABSTRACT

A method is disclosed to manufacture a capacitor structure having a high capacitance and a flat topography on a semiconductor device. The method includes steps of: (a) forming a first insulating layer over a substrate having a transistor structure; (b) forming a first and a second contact holes on the first insulating layer; (c) forming a first conducting layer over the first insulating layer; (d) forming a bit line structure above the first contact hole; (e) forming an etching stop layer and a second insulating layer over the substrate, and removing a portion of the etching stop layer and the second insulating layer for forming a capacitor area wherein the second contact plug is exposed; (f) forming a second conducting layer over the substrate, and forming a sacrificial layer in the capacitor area for covering a portion of the second conducting layer; (g) forming the capacitor structure in the capacitor area.

19 Claims, 19 Drawing Sheets

METHOD FOR MANUFACTURING CAPACITOR STRUCTURE OF DYNAMIC MEMORY CELL

FIELD OF THE INVENTION

The invention relates to a capacitor structure and a method for manufacturing the capacitor structure, and especially relates to a capacitor structure of a dynamic memory cell.

BACKGROUND OF THE INVENTION

Due to the requirement of high integration, the scales of semiconductor devices must be reduced. Accordingly, the capacitance of a capacitor structure existing in a memory device such as a dynamic random access memory (DRAM) cell may be influenced by the reduced area of the device on the wafer. A small capacitance of a memory cell will make the data reading/writing process of the memory cell be easily influenced by noises and thus cannot proceed normally. To increase the capacitance on a limited area without influencing the integration, a capacitor structure as illustrated in FIG. 1 is applied by most conventional DRAM cells. The conventional DRAM cell includes a metal-oxide-semiconductor (MOS) transistor 11, a bit line structure 12, and the capacitor structure constructed by the electrode layers 13, 15 and the dielectric layer 14. For maintaining a sufficient capacitance, the height of the capacitor structure is extended to increase the effective capacitor junction area (i.e. the real area of the dielectric layer) without affecting the integration of the devices on the wafer. However, such an extension will cause a serious problem: an up-and-down topography 16. Such a topography may cause an up-and-down surface of the other substance such as a metal layer formed in the succeeding procedures. If a photolithography procedure is applied on the metal layer, due to the limitation of depth of focus of the photolithography procedure, the high reflectivity and the up-and-down surface of the metal layer, the pattern on the photoresistant cannot be defined exactly. In a high integration wafer, such a distortion may narrow or even disconnect the metal lines, and therefore reduce the yield. It is than attempted by the Applicant to deal with the abovementioned problem.

SUMMARY OF THE INVENTION

An object of the invention is to provide a method for manufacturing a capacitor structure of a semiconductor device having a high capacitance and a flat topography on the semiconductor device. The other object of the invention is to provide a capacitor structure of a semiconductor device with a high capacitance and a flat topography on the semiconductor device.

According to the invention, a method for manufacturing a capacitor structure of a semiconductor device includes steps of: (a) forming a first insulating layer over a substrate having a transistor structure; (b) forming a first and a second contact holes on the first insulating layer; (c) forming a first conducting layer over the first insulating layer for forming a first and a second contact plugs in the first and second contact holes respectively; (d) forming a bit line structure above the first contact hole; (e) forming an etching stop layer and a second insulating layer over the substrate, and removing a portion of the etching stop layer and the second insulating layer for forming a capacitor area wherein the second contact plug is exposed; (f) forming a second conducting layer over the substrate, and forming a sacrificial layer in the capacitor area for covering a portion of the second conducting layer; (g) removing the other portion of the second conducting layer for remaining the portion of the second conducting layer covered by the sacrificial layer to form a first electrode layer of the capacitor structure; and (h) removing the sacrificial layer and forming a third insulating layer and a third conducting layer serving as a dielectric layer and a second electrode layer of the capacitor structure respectively.

In accordance with an aspect of the invention, wherein the semiconductor device is preferably a dynamic random access memory (DRAM) cell.

In accordance with another aspect of the invention, wherein the transistor structure is preferably a metal oxide semiconductor (MOS) transistor structure having a gate connected to the word line structure.

In accordance with another aspect of the invention, wherein the MOS transistor structure preferably further includes a source and a drain contacting with the first and second contact plug respectively.

In accordance with another aspect of the invention, preferably further including a step before the step c) of: c0) ion implanting portions of the substrate below the first and second contact holes respectively for forming the source and the drain of the MOS transistor structure.

In accordance with another aspect of the invention, wherein the first conducting layer is preferably a polysilicon layer.

In accordance with another aspect of the invention, wherein the step e) preferably includes steps of: e1) forming the etching stop layer over the substrate; e2) forming the second insulating layer over the etching stop layer; e3) defining a pattern of the capacitor area on the second insulating layer; e4) etching the second insulating layer according to the pattern of the capacitor area for exposing the portion of the etching stop layer, and e5) etching the portion of the etching stop layer for exposing the second contact plug.

In accordance with another aspect of the invention, wherein the step e4) is preferably performed by an anisotropic etching.

In accordance with another aspect of the invention, wherein the step e4) is preferably started with an isotropic etching and performed by anisotropic etching.

In accordance with another aspect of the invention, wherein the etching stop layer is preferably a silicon nitride layer, and the second insulating layer is preferably an oxide layer.

In accordance with another aspect of the invention, wherein the second conducting layer is preferably a polysilicon layer.

In accordance with another aspect of the invention, wherein the second conducting layer is preferably a rugged polysilicon layer.

In accordance with another aspect of the invention, wherein the sacrificial layer is preferably selected from a group consisting of a photoresistant layer, a silicon dioxide layer, a spin-on glass layer, a phosphosilicate glass (PSG) layer and a borophosphosilicate glass (BPSG) layer.

In accordance with another aspect of the invention, wherein the step f) preferably further includes an etching back process for forming the sacrificial layer in the capacitor area.

In accordance with another aspect of the invention, wherein the step g) is preferably performed by a process selected from a group consisting of an etching process and a chemical-mechanical polishing process.

In accordance with another aspect of the invention, wherein the third insulating layer is preferably selected from a group consisting of an oxide layer and a nitride layer, and the third conducting layer is a polysilicon layer.

In accordance with another aspect of the invention, preferably further including a step before step e) of: e0) forming a spacer around the bit line structure.

In accordance with another aspect of the invention, wherein the spacer is preferably made by a material selected from a group consisting of a silicon dioxide, a PSG and a BPSG.

In accordance with another aspect of the invention, a method for manufacturing a capacitor structure of a semiconductor device, includes steps of: (a) forming a first insulating layer over a substrate having a transistor structure; (b) forming a first contact hole on the first insulating layer; (c) forming a first conducting layer over the first insulating layer for forming a first contact plug in the first contact hole; (d) forming a bit line structure above the first contact hole; (e) forming an etching stop layer over the substrate; (f) defining a pattern of the second contact hole on the etching stop layer; (g) removing a portion of the etching stop layer according to the pattern of the second contact hole; (h) forming a second insulating layer over the substrate; (i) defining a pattern of a capacitor area on the second insulating layer, and etching the second insulating layer according to the pattern of the capacitor area for forming the capacitor area; (j) forming a second contact hole under the capacitor area; (k) forming a second conducting layer over the substrate, and forming a sacrificial layer in the capacitor area for covering a portion of the second conducting layer; (l) removing the other portion of the second conducting layer for remaining the portion of the second conducting layer covered by the sacrificial layer to form a first electrode layer of the capacitor structure; and (m) removing the sacrificial layer and forming a third insulating layer and a third conducting layer serving as a dielectric layer and a second electrode layer of the capacitor structure respectively.

In accordance with another aspect of the invention, wherein the semiconductor device is preferably a dynamic random access memory (DRAM) cell.

In accordance with another aspect of the invention, wherein the transistor structure is preferably a metal-oxide-semiconductor (MOS) transistor structure having a gate connected to the word line structure.

In accordance with another aspect of the invention, wherein the MOS transistor structure preferably further includes a source and a drain contacting with the first and second contact plug respectively.

In accordance with another aspect of the invention, wherein the first conducting layer is preferably a polysilicon layer.

In accordance with another aspect of the invention, wherein the step i) preferably includes steps of: i1) defining the pattern of the capacitor area on the second insulating layer; and i2) etching the second insulating layer according to the pattern of the capacitor area for exposing a portion of the etching stop layer defined in the capacitor area; and the step (j) includes steps of: j1) etching the first insulating layer according to the pattern of the second contact hole for forming the second contact hole; and j2) removing the portion of the etching stop layer in the capacitor area.

In accordance with another aspect of the invention, wherein the step i2) is preferably performed by an anisotropic etching.

In accordance with another aspect of the invention, wherein before the anisotropic etching of the step i2), preferably further includes an isotropic etching step.

In accordance with another aspect of the invention, wherein the etching stop layer is preferably a silicon nitride layer, and the second insulating layer is an oxide layer.

In accordance with another aspect of the invention, wherein the second conducting layer is preferably a polysilicon layer.

In accordance with another aspect of the invention, wherein the second conducting layer is preferably a rugged polysilicon layer.

In accordance with another aspect of the invention, wherein the sacrificial layer is preferably selected from a group consisting of a photoresistant layer, a silicon dioxide layer, a spin-on glass layer, a phosphosilicate glass (PSG) layer and a borophosphosilicate glass (BPSG) layer.

In accordance with another aspect of the invention, wherein the step k) preferably further includes an etching back process for forming the sacrificial layer in the capacitor area.

In accordance with another aspect of the invention, wherein the step l) is preferably performed by a process selected from a group consisting of an etching process and a chemical-mechanical polishing process.

In accordance with another aspect of the invention, wherein the third insulating layer is preferably selected from a group consisting of an oxide layer and a nitride layer, and the third conducting layer is a polysilicon layer.

In accordance with another aspect of the invention, preferably further including a step before the step e) of: e0) forming a spacer around the bit line structure.

In accordance with another aspect of the invention, wherein the spacer is preferably made by a material selected from a group consisting of a silicon dioxide, a PSG and a BPSG.

In accordance with another aspect of the invention, a capacitor structure for a semiconductor device having an insulating layer having a trench thereon, the capacitor formed within the trench, includes: a first electrode layer covering over an inner sidewall of the trench; a dielectric layer overlying the first electrode layer; and a second electrode layer overlying the dielectric layer.

In accordance with another aspect of the invention, wherein the semiconductor device is preferably a dynamic memory cell having a charging/discharging channel, and the first electrode layer is connected to the charging/discharging channel by a plug.

In accordance with another aspect of the invention, wherein the first electrode layer is a polysilicon layer.

In accordance with another aspect of the invention, wherein the first electrode is preferably a rugged polysilicon layer.

In accordance with another aspect of the invention, wherein the dielectric layer is preferably selected from a group consisting of an oxide layer and a nitride layer.

In accordance with another aspect of the invention, wherein the trench is preferably formed by an anisotropic etching.

In accordance with another aspect of the invention, wherein the trench is preferably formed by an isotropic etching followed by an anisotropic etching.

The invention may best be understood through the following description with reference to the accompanying drawings, in which:

DETAILED DESCRIPTION OF THE PREFERRED EMBODIMENTS

Figure 1:
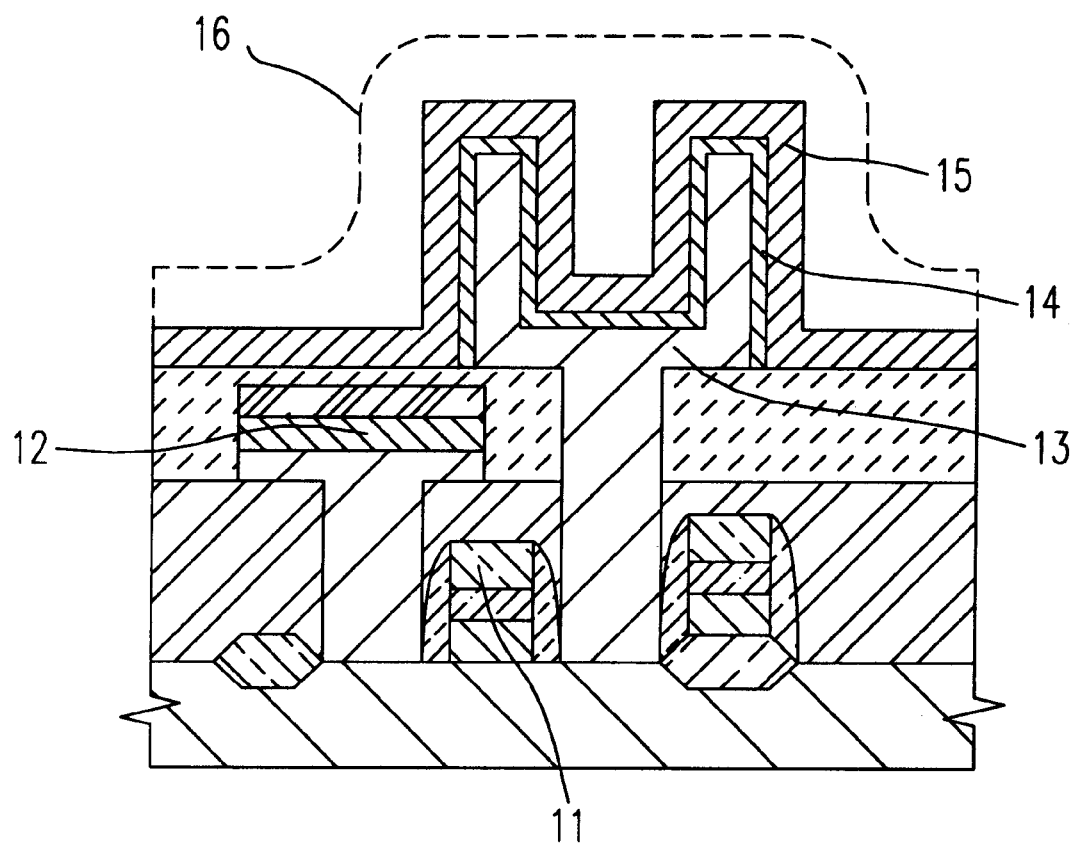
FIG. 1 is an illustration of a conventional structure of a dynamic memory cell.
Figure 2A:
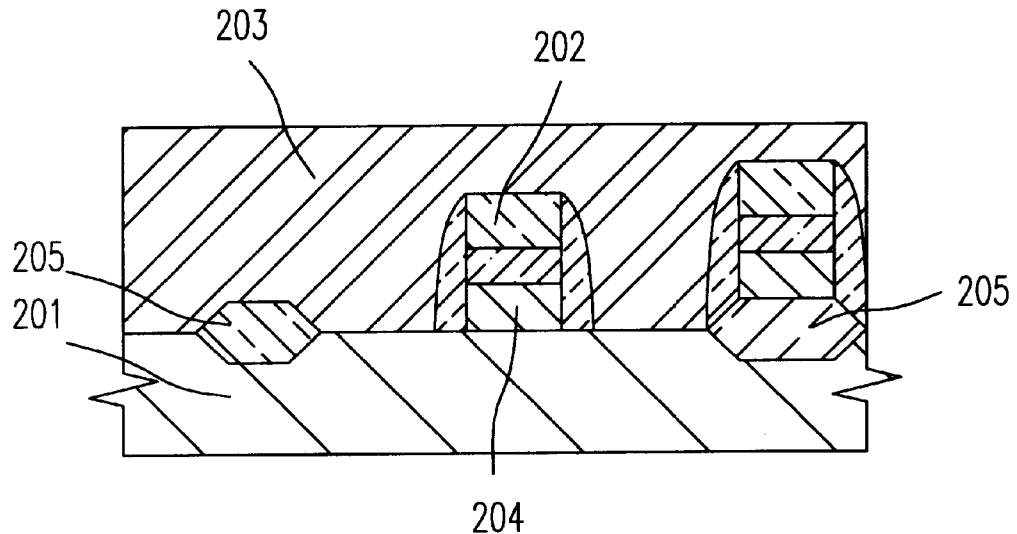
FIGS. 2(a)–2(m) illustrate the manufacturing procedure of a preferred embodiment of a capacitor structure according to the invention.

FIGS. 2(a)–2(m) illustrate a preferred embodiment of the method for manufacturing the capacitor structure of the invention. FIG. 2(a) includes steps of:

2a1) preparing a substrate 201 having a MOS transistor 202 and a word line 204 connected to the MOS transistor 202, the substrate further including a field oxide layer 205 for separating the memory cell structure from the other devices on the substrate 201; and 2a2) forming an insulating layer 203 over the substrate 201, wherein the insulating layer 203 may be made of silicon dioxide, phosphosilicate glass (PSG) or borophosphosilicate glass (BPSG).

Figure 2B:
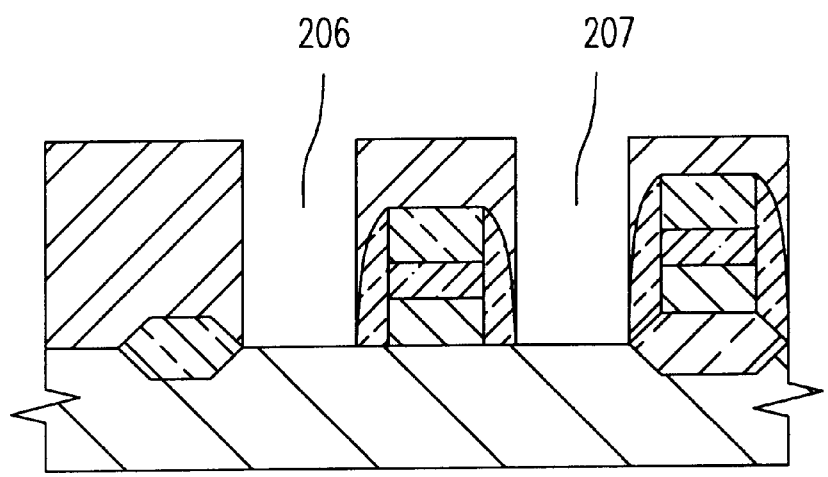

FIG. 2(b) includes a step of:

2b1) forming contact holes 206, 207 on the insulating layer 203 by photolithography and etching processes for a bit line and a capacitor respectively.

Figure 2C:
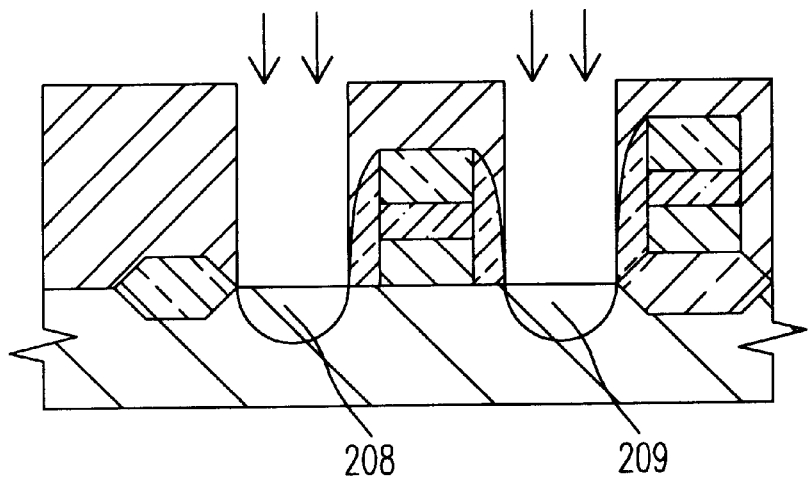

FIG. 2(c) includes a step of:

2c1) ion implanting the substrate 201 on the portions exposed in the contact holes 206, 207 to form the source and drain of the MOS transistor 202 and two junction areas 208 and 209 having relatively low contact resistances.

Figure 2D:
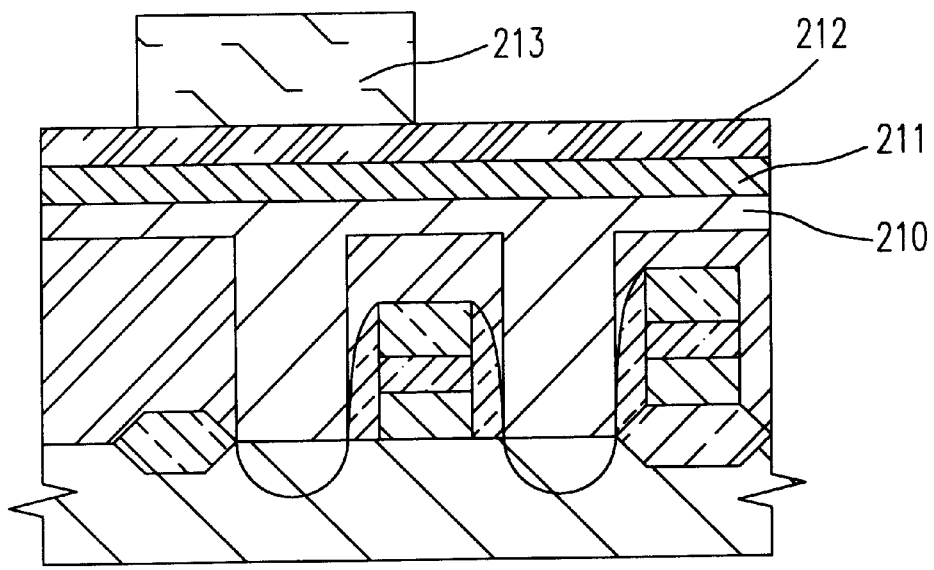

FIG. 2(d) includes steps of:

2d1) forming a polysilicon layer 210 over the substrate 201 as a conducting layer, wherein the conducting layer 210 fills up the contact holes 206 and 207 and contacts with junction areas 208 and 209;

2d2) forming a silicide layer 211 over the conducting layer 210, where the silicide layer 211 may be a tungsten silicide layer; and 2d3) forming an insulating layer 212 over the silicide layer 211, where the insulating layer may be made of silicon dioxide, PSG or BPSG.

Figure 2E:
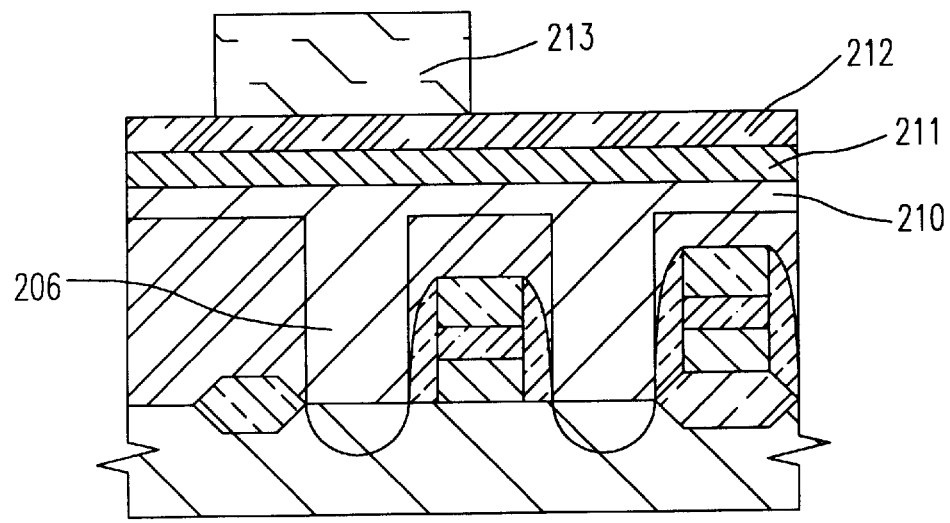

FIG. 2(e) includes a step of:

2e1) forming a photoresistant layer 213 over the insulating layer 212 and defining a pattern of a bit line area 214 on the photoresistant layer 213.

Figure 2F:
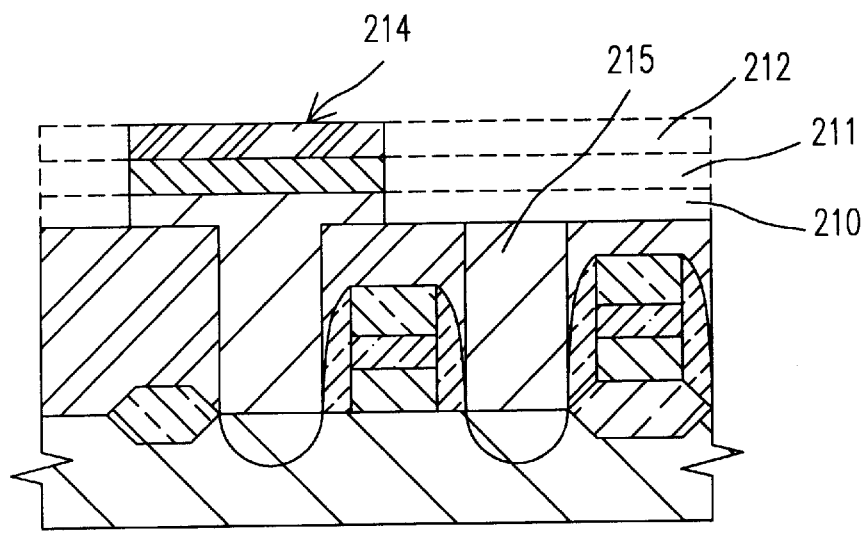

FIG. 2(f) includes steps of:

2f1) etching the insulating layer 212, the silicide layer 211 and the conducting layer 210 according to the pattern of the bit line structure 214; until the surface of the insulating layer 203 is exposed and the contact plug 215 is formed; and 2f2) removing the photoresistant layer 213.

Figure 2G:
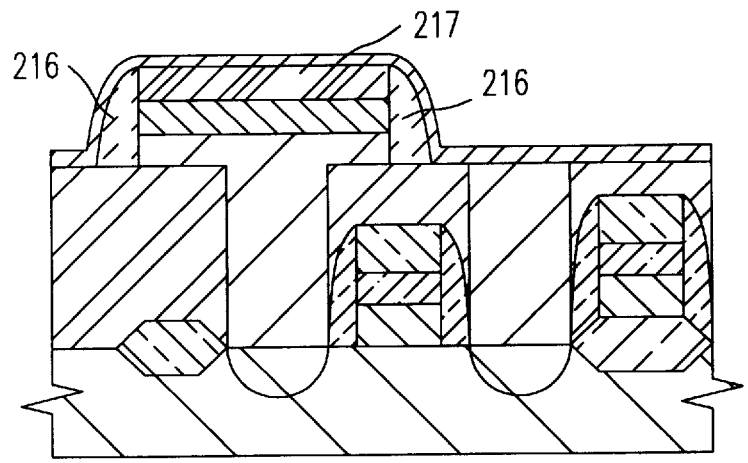

FIG. 2(g) includes steps of:

2g1) forming a spacer 216 of the bit line structure 214 by a silicon dioxide layer; and 2g2) forming a silicon nitride layer 217 to be an etching stop layer.

Figure 2H:
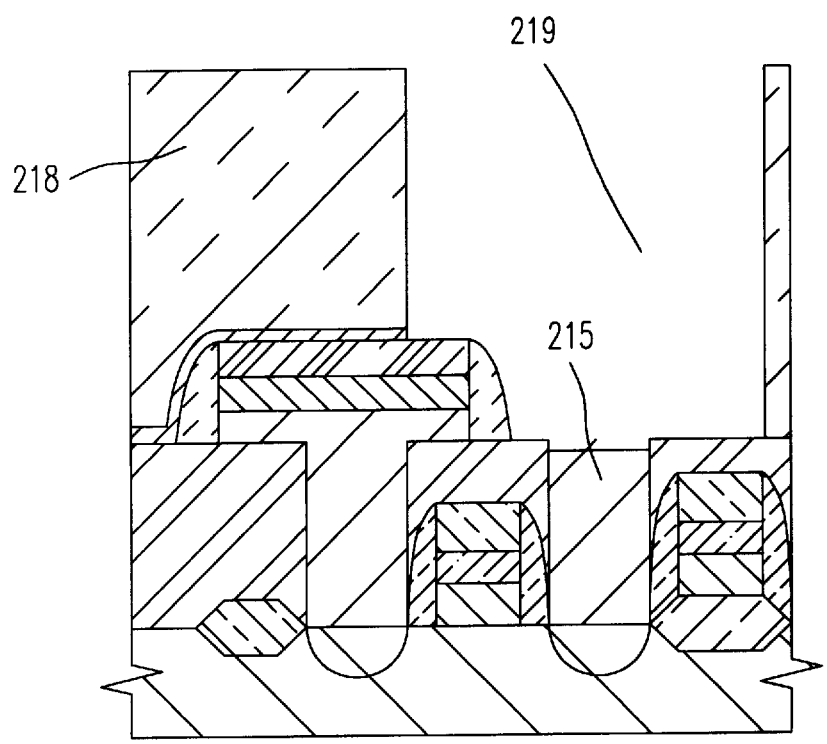

FIG. 2(h) includes steps of:

2h1) forming an insulating layer 218 on the substrate, where the insulating layer 218 may be made of silicon dioxide, PSG or BPSG;

2h2) defining a pattern of a trench area 219 on the insulating layer 218, where the trench area is prepared for forming the capacitor structure therein;

2h3) undergoing an anisotropic etching on the insulating layer 218 until a portion of the etching stop layer 217 is exposed in the trench area, i.e., the capacitor area 219; and 2h4) undergoing an anisotropic or isotropic etching for removing the etching stop layer exposed in the capacitor area to expose the contact plug 215.

Figure 2I:
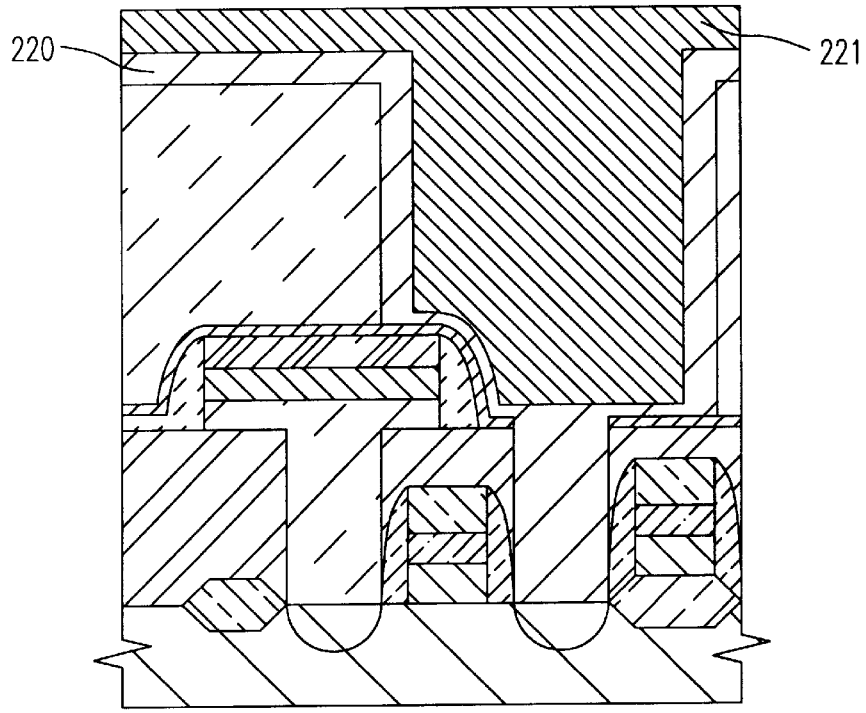

FIG. 2(i) includes steps of:

2i1) forming a conducting layer 220 composed by polysilicon over the substrate, where the conducting layer 220 will serve as an electrode layer of the capacitor structure;

2i2) forming a sacrificial layer 221 on the substrate and filling up the trench area 219, where the sacrificial layer 221 may be made of a photoresistant such a polyimide, or any one of silicon dioxide, spin-on glass, PSG and BPSG.

Figure 2J:
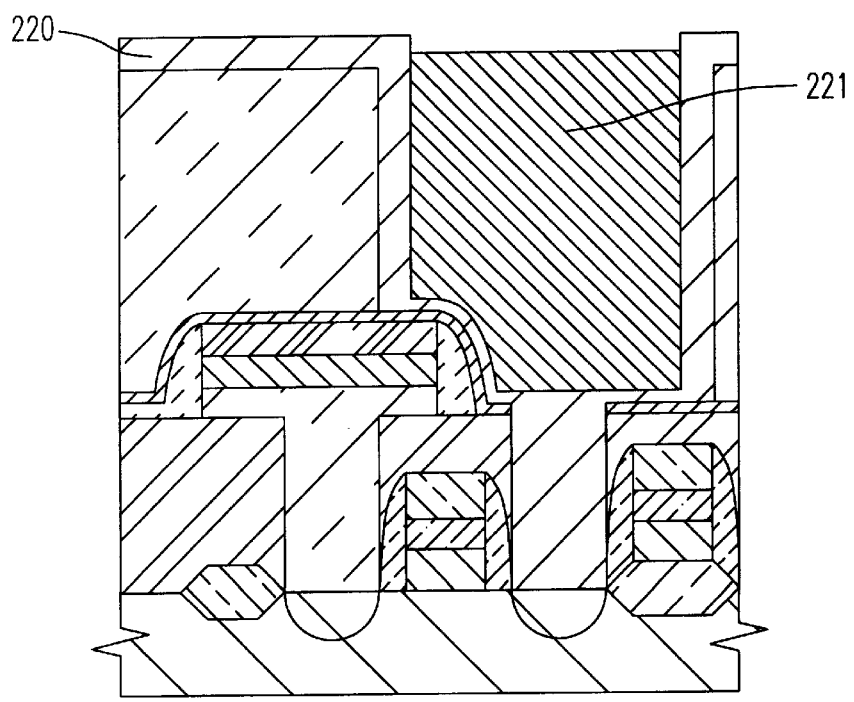

FIG. 2(j) includes a step of:

2j1) etching back the sacrificial layer 221 for removing the portion of the sacrificial layer 221 which is not in the trench area 219, and exposing a portion of the conducting layer 220 outside the trench area 219.

Figure 2K:
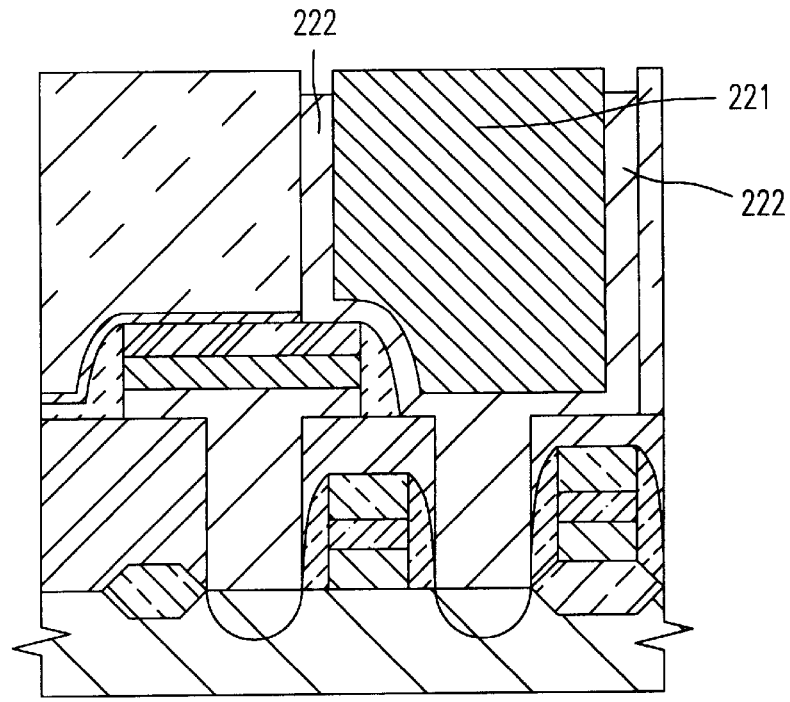

FIG. 2(k) includes a step of:

2k1) etching the conducting layer 220 for removing the exposed portion of the conducting layer 220 and obtaining a first electrode layer 222 of the capacitor structure, where the electrode layer 222 is distributed on the sidewall and bottom of the trench area 219, and will not extend above the surface of the bulk structure of the memory cell.

Figure 2L:
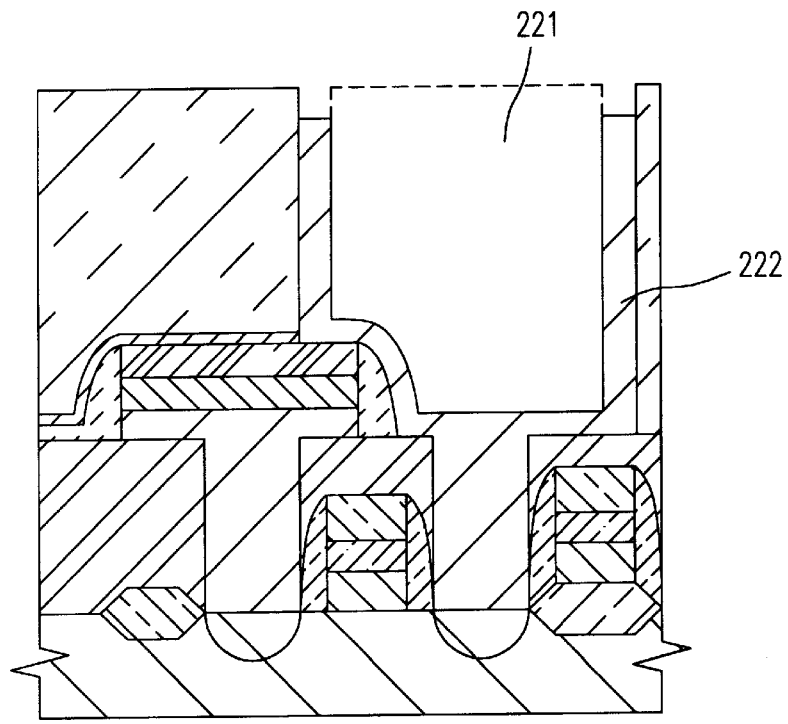

FIG. 2(l) includes a step of:

2l1) executing an etching procedure for removing the sacrificial layer 221.

Figure 2M:
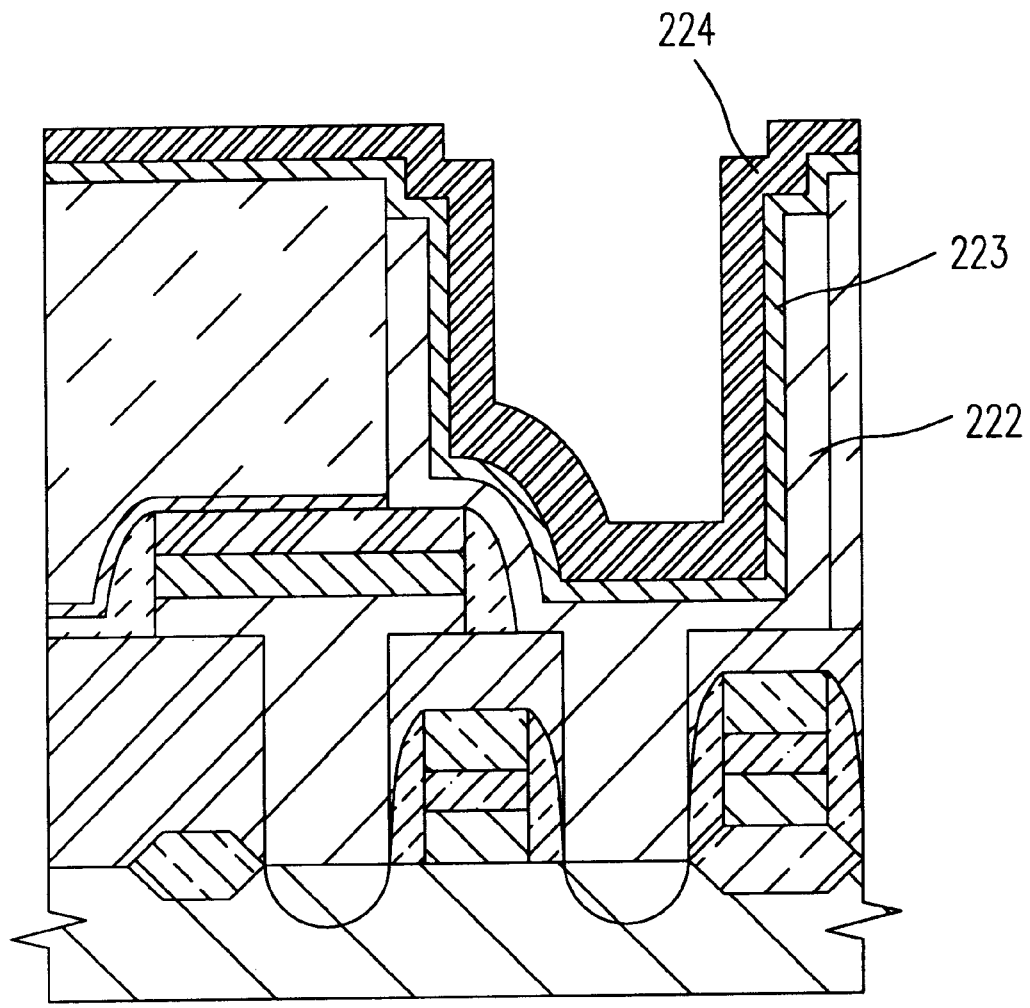

FIG. 2(m) includes steps of:

2m1) forming an insulating layer 223 above the substrate 201, where the insulating layer 223 serves as the dielectric layer of the capacitor structure, and is made of oxide layer, nitride layer or the combination of both; and 2m2) forming a conducting layer 224 above the insulating layer 223, where the conducting layer 224 is a polysilicon layer serving as the second electrode layer of the capacitor structure.

Figure 2N:
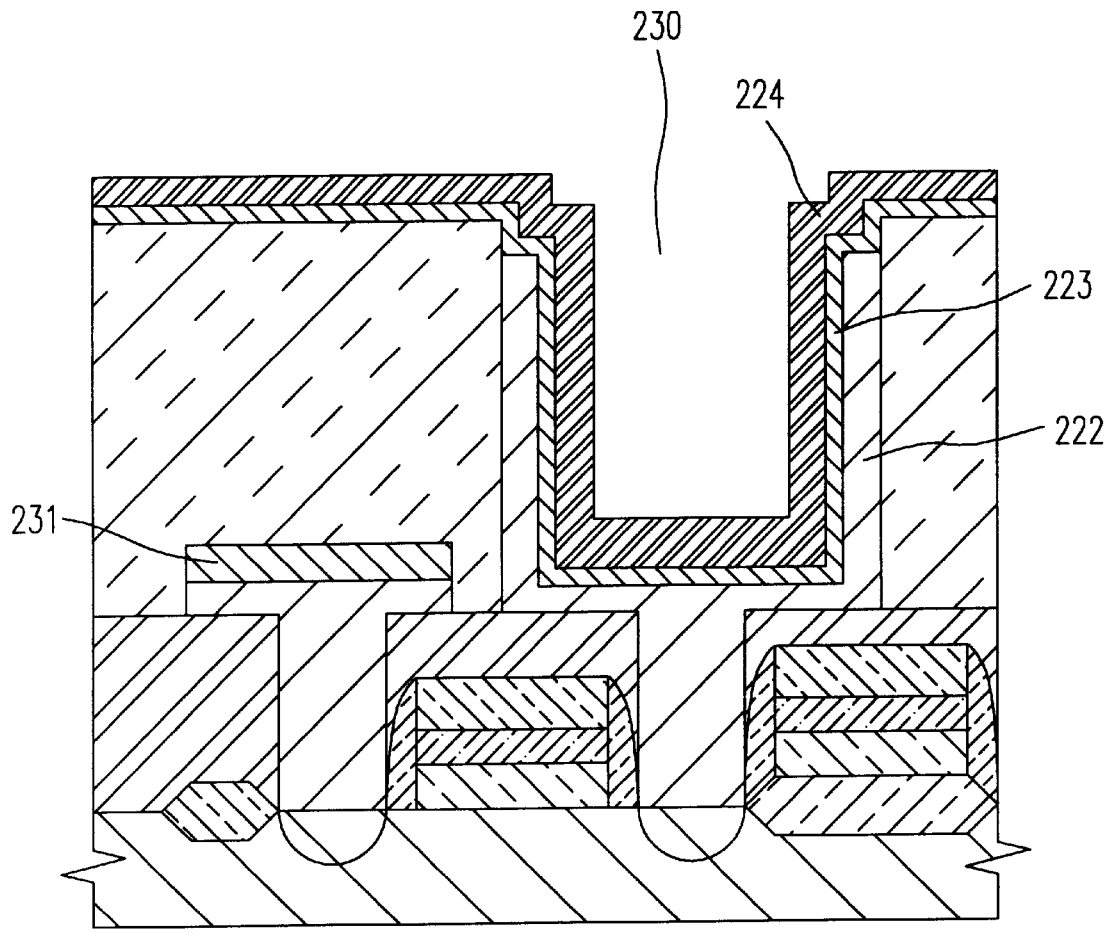
FIG. 2(n) illustrate another preferred embodiment of a capacitor structure according to the present invention.

In another preferred embodiment of the present invention, the capacitor structure 230 are formed far apart from the bit line structure 231, as shown in FIG. 2(n), such that a short circuit will not happen between the bit line structure 231 and the capacitor structure 230.

Figure 3A:
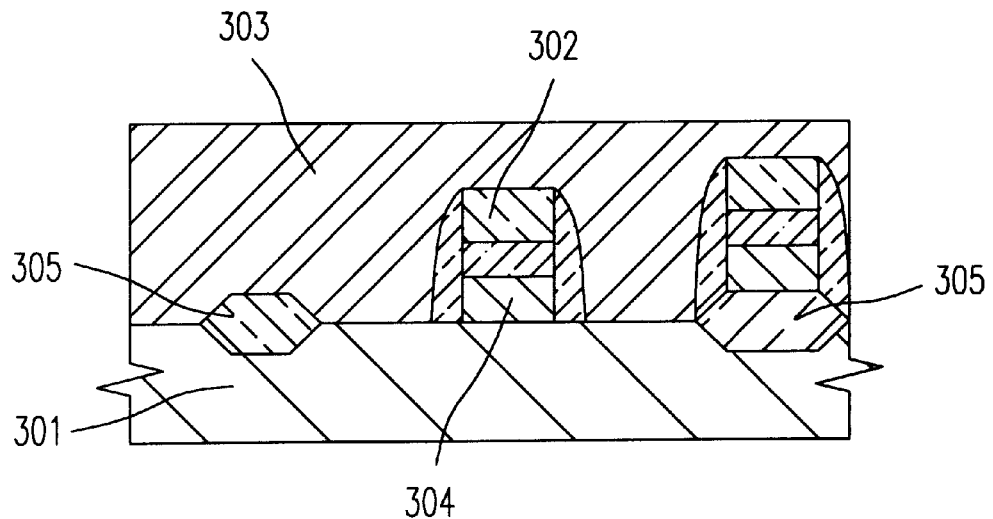
FIGS. 3(a)–3(m) illustrate the manufacturing procedure of another preferred embodiment of a capacitor structure according to the invention.

FIGS. 3(a)–3(m) illustrate another preferred embodiment of the manufacturing method of a capacitor structure according to the invention. FIG. 3(a) includes steps similar to those of FIG. 2(a):

3a1) preparing a substrate 301 having a MOS transistor 302 and a word line 304 connected to the MOS transistor 302, where the substrate 302 also further includes a field oxide layer 305 for separating the memory cell structure from the other devices on the substrate; and 3a2) forming an insulating layer 303 over the substrate 301, where the insulating layer 303 may be made of silicon dioxide, phosphosilicate glass (PSG) or borophosphosilicate glass (BPSG).

Figure 3B:
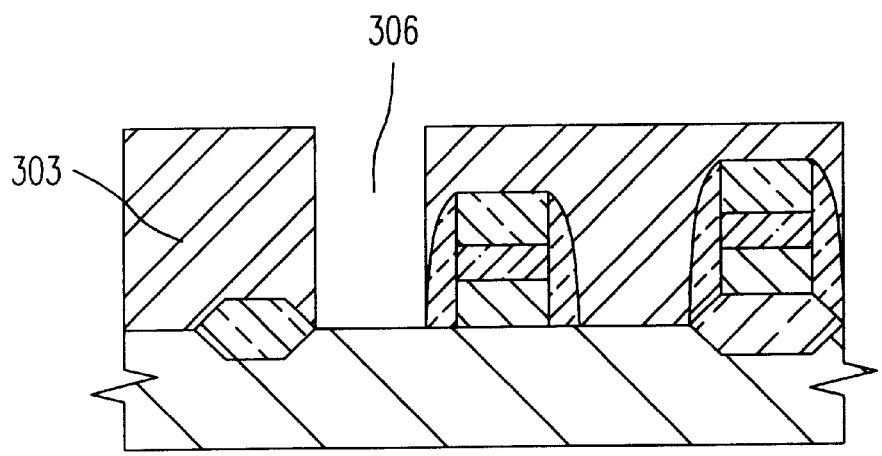

FIG. 3(b) includes a step of:

3b1) forming a contact hole 306 on the insulating layer 303 by a photolithography and etching procedure, where the contact hole 306 is prepared for a bit line structure.

Figure 3C:
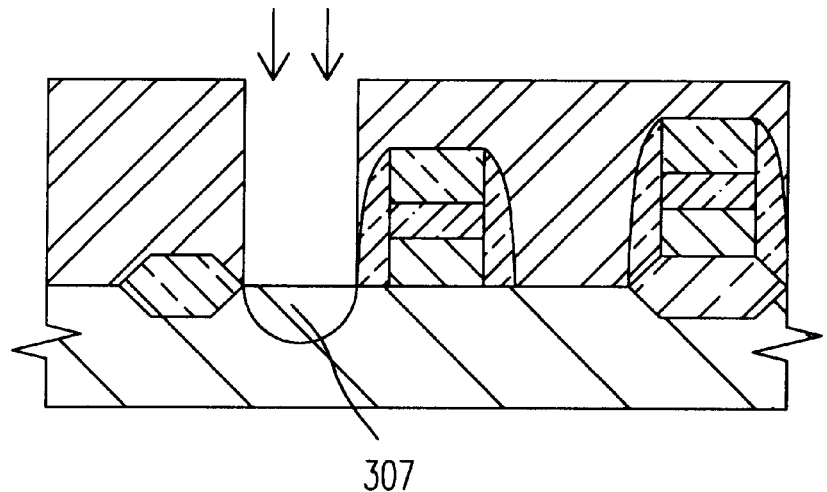

FIG. 3(c) includes a step of

3c1) ion implanting a portion of the substrate exposed in the contact hole 306 for forming a low-resistance junction area 307 serving as the drain of the MOS transistor 302.

Figure 3D:
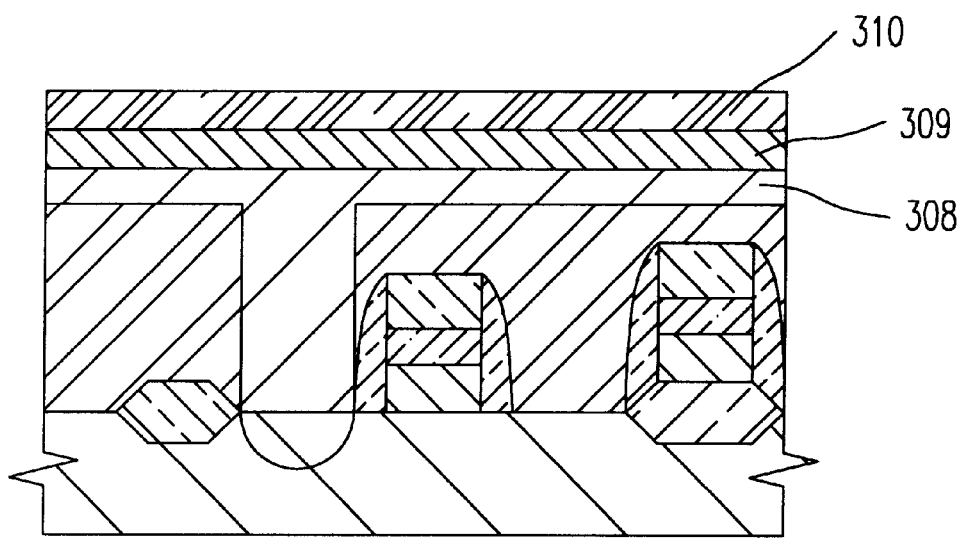

FIG. 3(d) includes steps of:

3d1) forming a conducting layer 308 above the substrate, where the conducting layer 308 is a polysilicon layer, fills up the contact hole 306 and contacts with the junction area 307;

3d2) forming a silicide layer 309 over the conducting layer 308, where the silicide layer 309 may be a tungsten silicide layer; and 3d3) forming an insulating layer 310 over the silicide layer 309, where the insulating layer 310 may be made of silicon dioxide, PSG or BPSG.

Figure 3E:
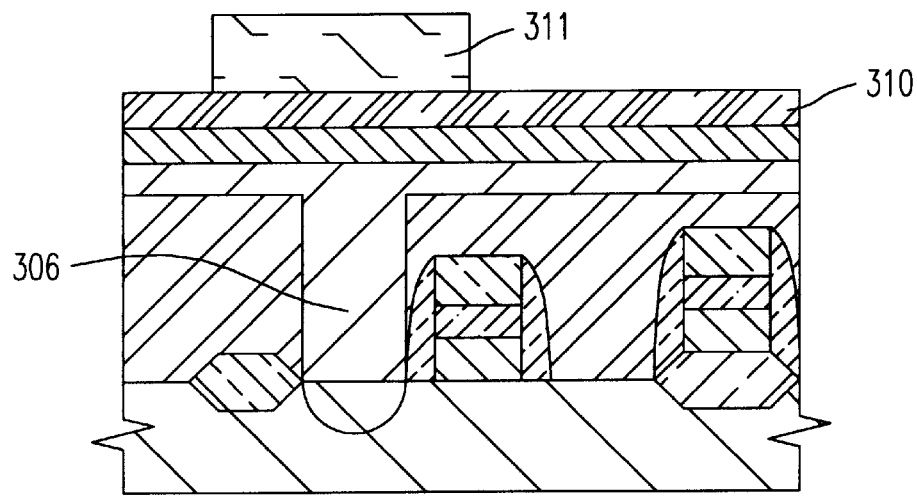

FIG. 3(e) includes a step of:

3e1) forming a photoresistant layer 311 over the insulating layer 310 and defining a pattern of a bit line area 313 on the photoresistant layer 311.

Figure 3F:
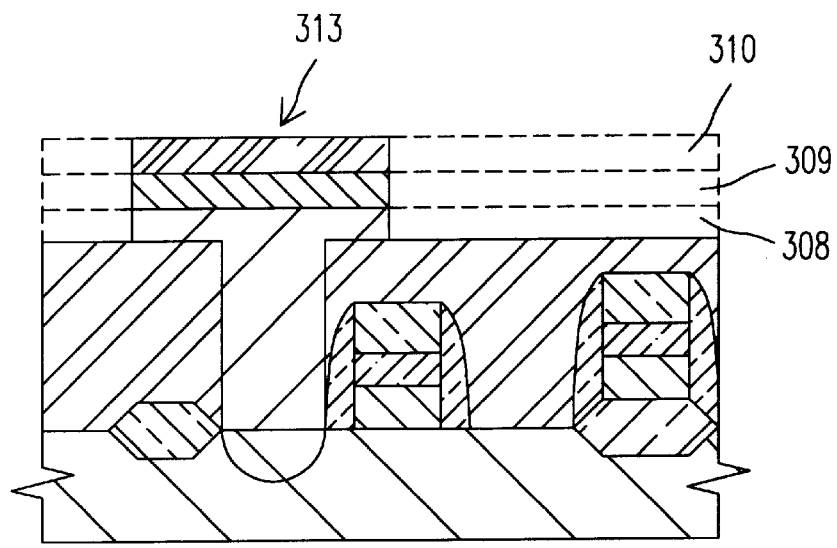

FIG. 3(f) includes steps of:

3f1) etching the insulating layer 310, the silicide layer 309 and the conducting layer 308 according to the pattern of the bit line structure 313, until the surface of the insulating layer 303 is exposed; and 3f2) removing the photoresistant layer 311.

Figure 3G:
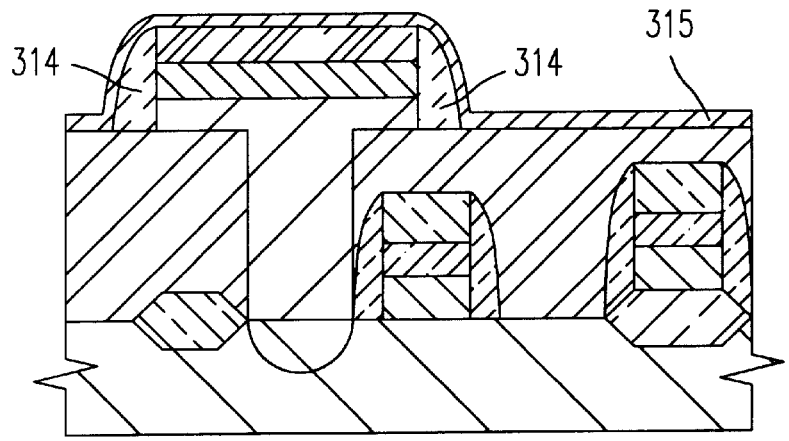

FIG. 3(g) includes steps of:

3g1) forming a spacer 314 of the bit line structure 313 by a silicon dioxide layer; and 3g2) forming a silicon nitride layer 315 to be an etching stop layer.

Figure 3H:
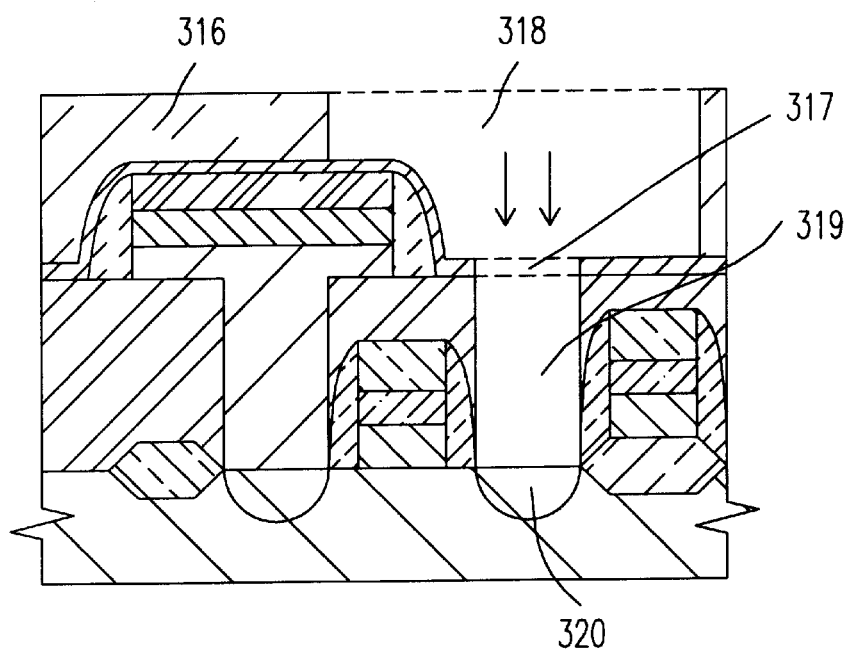

FIG. 3(h) includes steps of:

3h1) defining a pattern of the contact hole 319 on the etching stop layer 315, and removing a portion of the etching stop layer 315 according to the pattern to form an opening 317 and expose a portion of the insulation layer 303;

3h2) forming an insulating layer 316 on the substrate, where the insulating layer 316 may be made of silicon dioxide, PSG or BPSG;

3h3) defining a pattern of a trench area 318 on the insulating layer 316, where the trench area is prepared for forming the capacitor structure therein;

3h4) undergoing an anisotropic etching on the insulating layer 316 until a portion of the etching stop layer 315 is exposed in the trench area, i.e., the capacitor area 318;

3h5) continuously undergoing the anisotropic etching for forming the contact hole 319 in the insulating layer 303; and 3h6) ion implanting a portion of the substrate 301 exposed in the contact hole 319 for forming a low-resistance junction area 320 serving as the source of the MOS transistor 302.

Figure 3I:
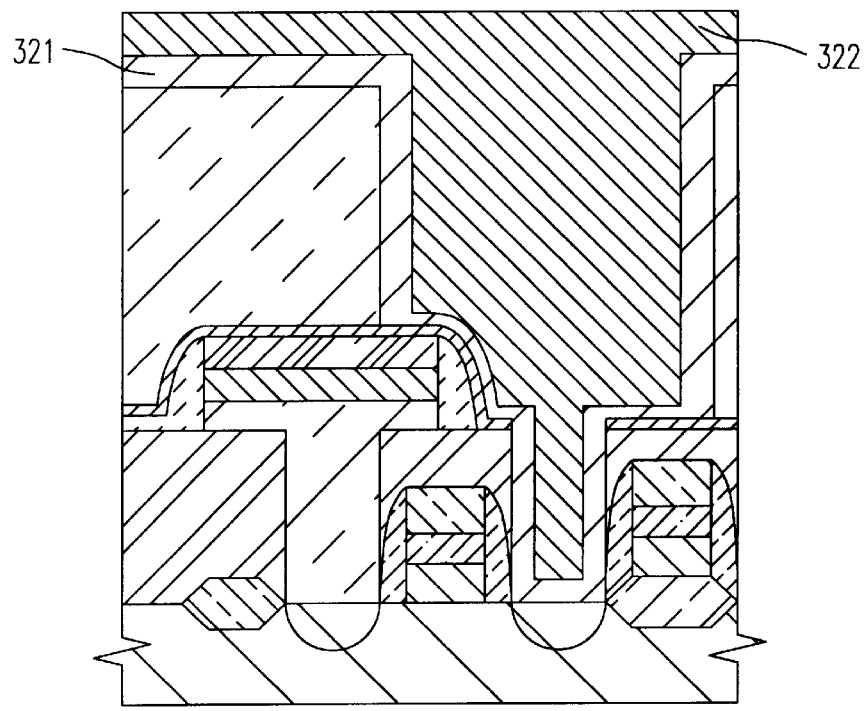

FIG. 3(i) includes steps of:

3i1) forming a conducting layer 321 composed by polysilicon over the substrate, wherein the conducting layer 321 will serve as an electrode layer of the capacitor structure;

3i2) forming a sacrificial layer 322 on the substrate and filling up the trench area 318, wherein the sacrificial layer 322 may be made of a photoresistant such as a polyimide, or any one of silicon dioxide, spin-on glass, PSG and BPSG.

Figure 3J:
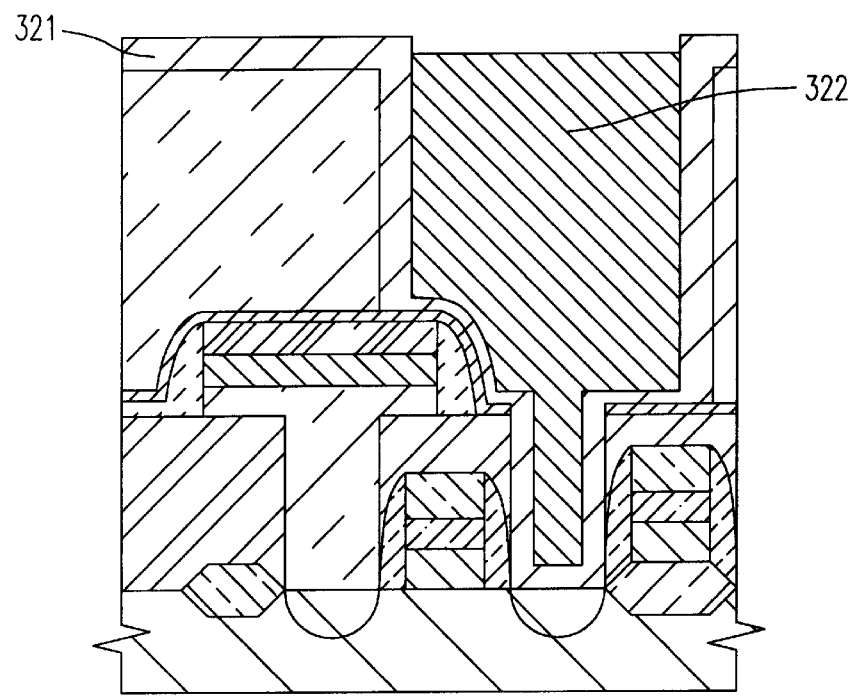

FIG. 3(j) includes a step of:

3j1) etching back the sacrificial layer 322 for removing the portion of the sacrificial layer 322 which is not in the trench area 318, and exposing a portion of the conducting layer 321 outside the trench area 318.

Figure 3K:
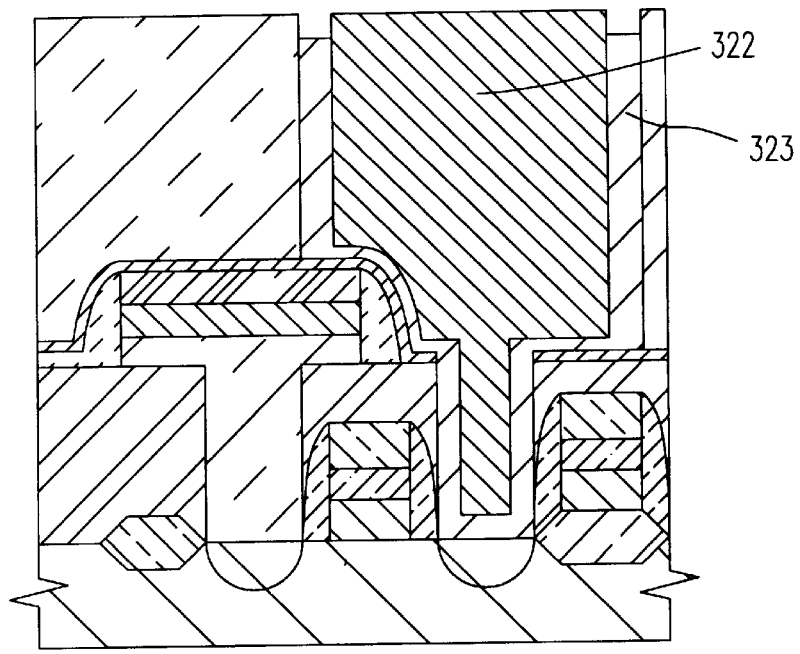

FIG. 3(k) includes a step of:

3k1) etching the conducting layer 321 for removing the exposed portion of the conducting layer 321 and obtaining a first electrode layer 323 of the capacitor structure, where the electrode layer 323 is distributed on the sidewalls and bottoms of the trench area 318 and the contact hole 319, and will not extend above the surface of the bulk structure of the memory cell.

Figure 3L:
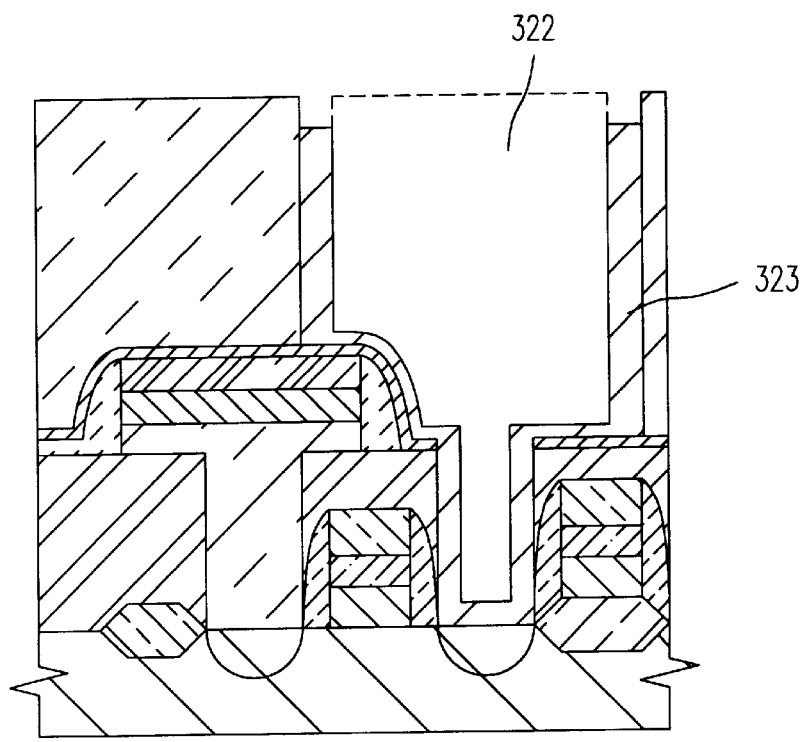

FIG. 3(l) includes a step of:

l1) executing an etching procedure for removing the sacrificial layer 322.

Figure 3M:
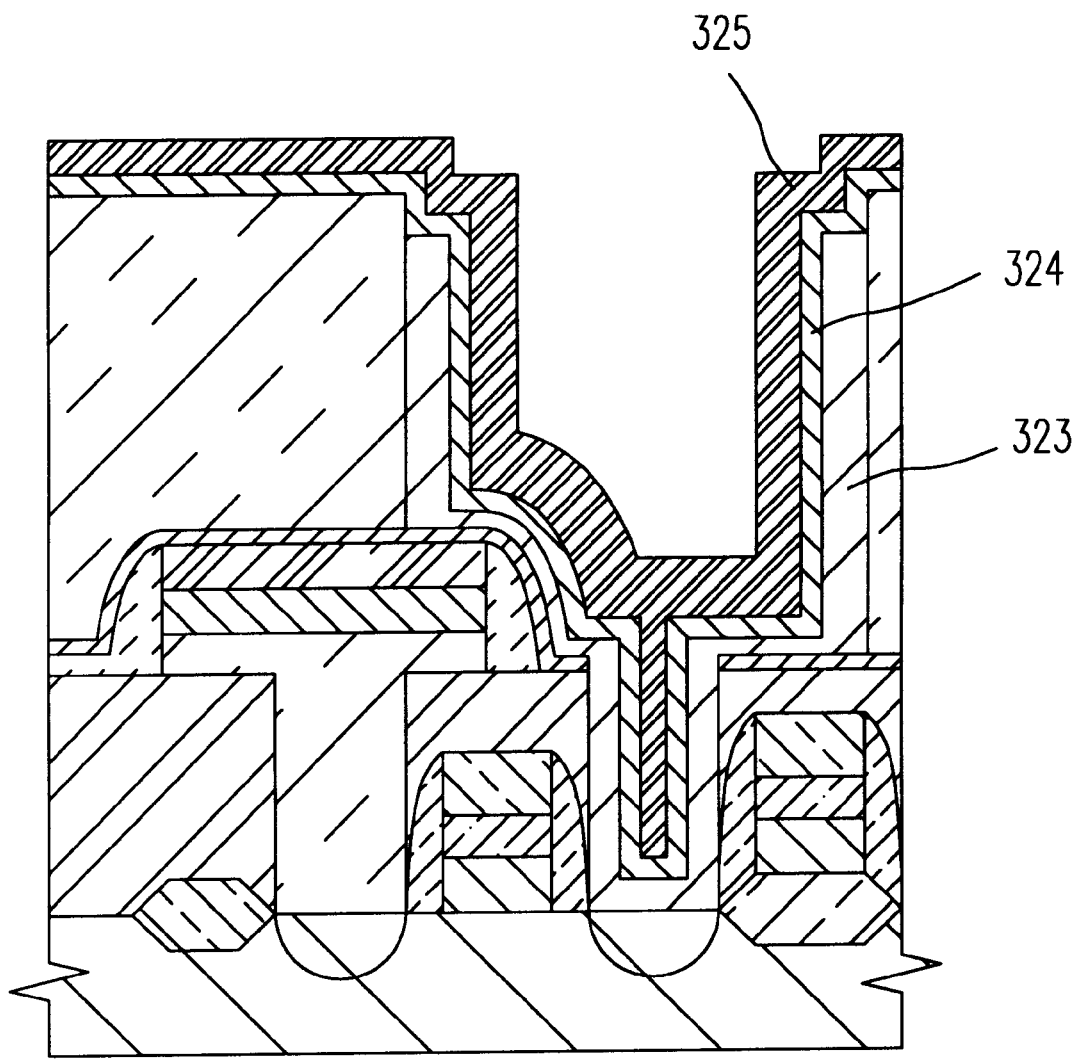

FIG. 3(m) includes steps of:

3m1) forming an insulating layer 324 above the substrate 301, where the insulating layer 324 serves as the dielectric layer of the capacitor structure, and is made of oxide layer, nitride layer or the combination of both; and 3m2) forming a conducting layer 325 above the insulating layer 324, where the conducting layer 325 is a polysilicon layer serving as the second electrode layer of the capacitor structure.

Figure 3N:
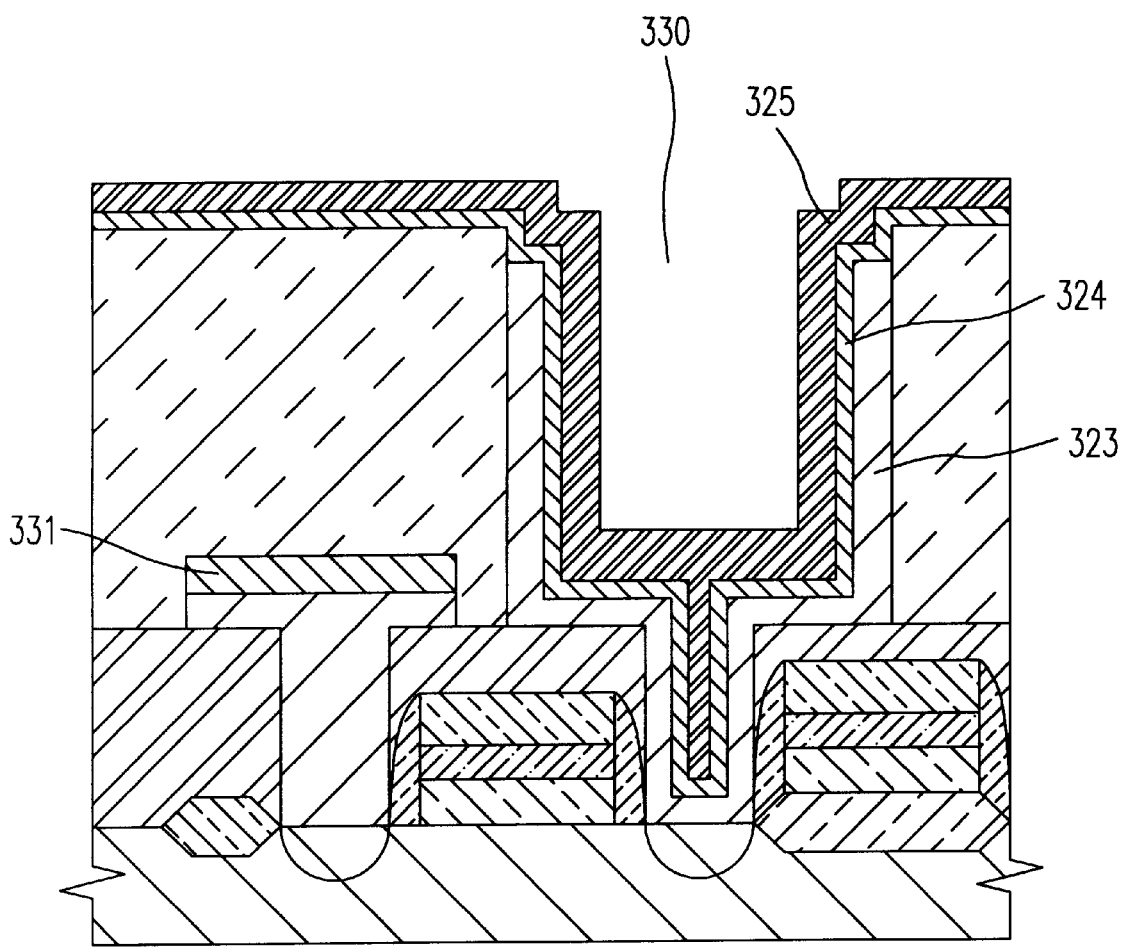
FIG. 3(n) illustrate still another preferred embodiment of a capacitor structure according to the present invention.
Figure 4:
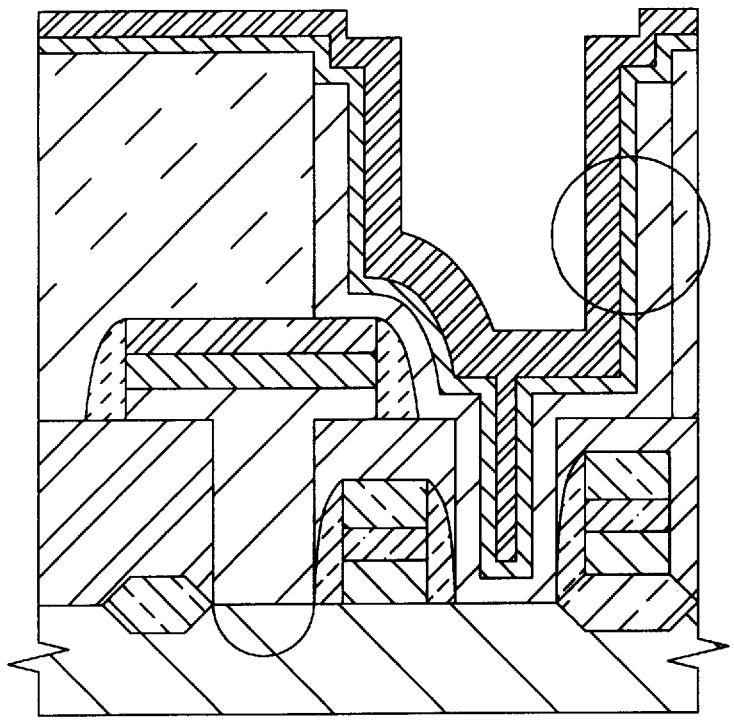
FIG. 4 illustrates a preferred embodiment of the capacitor structure having a rugged polysilicon electrode layer.
Figure 4A:
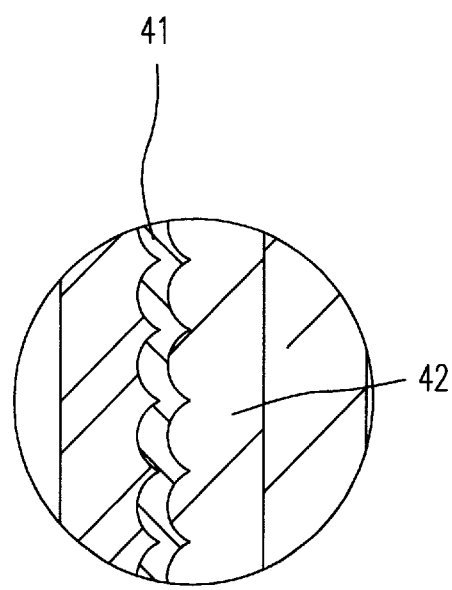
FIG. 4(a) is a partially scald-up diagram of FIG. 4.
Figure 5:
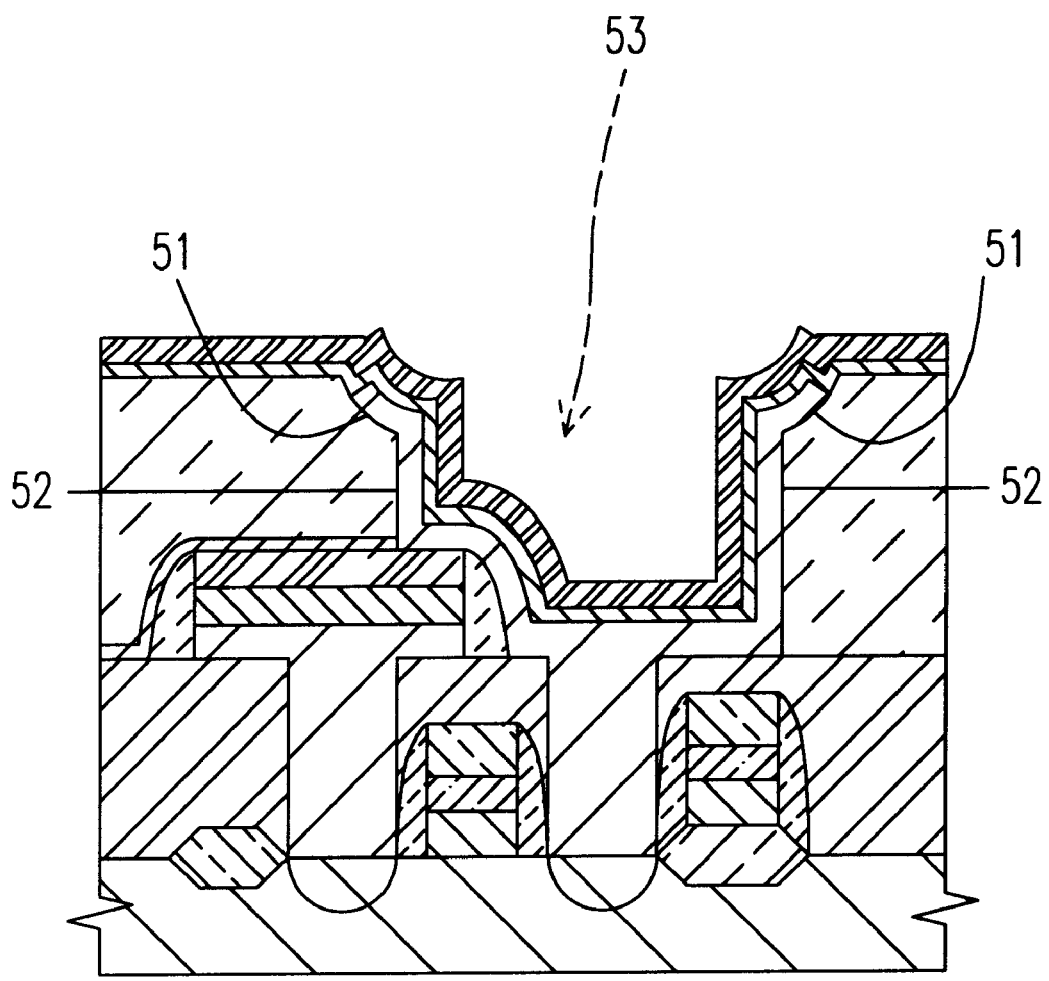
FIG. 5 illustrates another preferred embodiment of the capacitor structure according to the invention.

In another preferred embodiment of the present invention, the capacitor structure 330 are formed far apart from the bit line structure 331, as shown in FIG. 3(n), such that a short circuit will not happen between the bit line structure 331 and the capacitor structure 330. Each of the capacitor structures of the abovementioned preferred embodiments is formed in a trench structure of the memory cell and the top portion of the capacitor structure is almost on the surface of the bulk structure of the memory cell. Consequently, there will not exist any up-and-down topography on the surface of the semiconductor device, and the problems mentioned in the foregoing will no longer exist, too. For further increasing the capacitance of the capacitor structure of the invention, as illustrated in FIGS. 4 and 4(a), the electrode layer 42 can be a rugged polysilicon layer. The effective area of the dielectric layer 41 will increase, and thus increase the capacitance. The other method for increasing the effective area of the dielectric layer is illustrated in FIG. 5. Upon forming the capacitor area 53, the etching process is started with an isotropic etching for a period of time, and then performed by an anisotropic etching. Line 51 represents the portion of the capacitor area 53 performed by the isotropic etching, while the remaining portion performed by the anisotropic portion is indicated by line 52. It is thus shown that such a process may increase the effective area of the dielectric layer.

While the invention has been described in terms of what are presently considered to be the most practical and preferred embodiments, it is to be understood that the invention need not be limited to the disclosed embodiment. On the country, it is intended to cover various modifications and similar arrangements included within the spirit and scope of the appended claims which are to be accorded with the broadest interpretation so as to encompass all such modifications and similar structures.

What is claimed is:

1. A method for manufacturing a capacitor structure of a semiconductor device, comprising the steps of:
   a. forming a first insulating layer over a substrate having a transistor structure;
   b. forming a first and a second contact holes on said first insulating layer;
   c. forming a first conducting layer over said first insulating layer for forming a first and a second contact plugs in said first and second contact holes respectively;
   d. forming a silicide layer over said first conducting layer, and defining a pattern of a bit line structure over said silicide layer, and etching to form said bit line structure according to said pattern of said bit line structure;
   e. forming an etching stop layer and a second insulating layer over said substrate, and removing a portion of said etching stop layer and said second insulating layer for forming a capacitor area wherein said second contact plug is exposed;
   f. forming a second conducting layer over said substrate, and forming a sacrificial layer in said capacitor area for covering a portion of said second conducting layer;
   g. removing a portion of said second conducting layer above said second insulating layer so that a remaining portion of the second conducting layer covered by said sacrificial layer forms a first electrode;
   h. removing said sacrificial layer and forming a third insulating layer along a remaining portion of said second insulating layer and the remaining portion of said second conducting layer to serve as a dielectric layer; and
   i. forming a third conducting layer above said dielectric layer to serve as a second electrode layer of said capacitor structure and to result in a substantially smooth topography about said capacitor.

2. A method according to claim 1, wherein said semiconductor device is a dynamic random access memory (DRAM) cell.

3. A method according to claim 1 wherein said transistor structure is a metal oxide semiconductor (MOS) transistor structure having a gate connected to a word line structure, and said MOS transistor structure further includes a source and a drain contacting with said first and second contact plugs respectively.

4. A method according to claim 3, further including a step before said step c) of:
   c0) ion implanting portions of said substrate below said first and second contact holes respectively for forming said source and said drain of said MOS transistor structure.

5. A method according to claim 1 wherein said step e) includes steps of:
   e1) forming said etching stop layer over said substrate;
   e2) forming said second insulating layer over said etching stop layer;
   e3) defining a pattern of said capacitor area on said second insulating layer;
   e4) etching said second insulating layer according to said pattern of said capacitor area for exposing said portion of said etching stop layer; and
   e5) etching said portion of said etching stop layer for exposing said second contact plug.

6. A method according to claim 5 wherein said step e4) is performed by an anisotropic etching.

7. A method according to claim 5 wherein said step e4) is started with an isotropic etching and performed by an anisotropic etching.

8. A method according to claim 1 wherein said step f) further includes an etching back process for forming said sacrificial layer in said capacitor area.

9. A method according to claim 1 wherein said step g) is performed by a process selected from a group consisting of an etching process and a chemical-mechanical polishing process.

10. A method according to claim 1 wherein step (d) further includes a step of forming an insulating layer over said silicide layer before the etching to form said bit line structure, and a step of forming a spacer around said bit line structure before step (e).

11. A method for manufacturing a capacitor structure of a semiconductor device, comprising the steps of:
    (a) forming a first insulating layer over a substrate having a transistor structure;
    (b) forming a first contact hole on said first insulating layer;
    (c) forming a first conducting layer over said first insulating layer for forming a first plug in said first contact hole;
    (d) forming a bit line structure above said first contact hole;
    (e) forming an etching stop layer over said substrate;
    (f) defining a pattern of a second contact hole on said etching stop layer;
    (g) removing a portion of said etching stop layer according to said pattern of said second contact hole;
    (h) forming a second insulating layer over said substrate;
    (i) defining a pattern of a capacitor area on said second insulating layer, and etching said second insulating layer according to said pattern of said capacitor area for forming said capacitor area;
    (j) forming said second contact hole under said capacitor area;
    (k) forming a second conducting layer over said substrate for forming a second plug in said second contact hole, and forming a sacrificial layer in said capacitor area for covering a portion of said second conducting layer;
    (l) removing the other portion of said second conducting layer for remaining said portion of said second conducting layer covered by said sacrificial layer to form a first electrode layer of said capacitor structure; and
    (m) removing said sacrificial layer and forming a third insulating layer and a third conducting layer serving as a dielectric layer and a second electrode layer of said capacitor structure respectively.

12. A method according to claim 11, wherein said semiconductor device is a dynamic random access memory (DRAM) cell, and said transistor structure is a metal-oxide-semiconductor (MOS) transistor structure having a gate connected to a word line structure, a source and a drain which contact said first and second contact plugs respectively.

13. A method according to claim 11 wherein said step (i) includes steps of:
    (i1) defining said pattern of said capacitor area on said second insulating layer; and
    (i2) etching said second insulating layer according to said pattern of said capacitor area for exposing a portion of said etching stop layer defined in said capacitor area; and said step (j) includes steps of:

j1) etching said first insulating layer according to said pattern of said second contact hole for forming said second contact hole; and j2) removing said portion of said etching stop layer in said capacitor area.

14. A method according to claim 13 wherein said step i2) is performed by an anisotropic etching.

15. A method according to claim 14, wherein before said anisotropic etching of said step i2) and said step j1), further includes an isotropic etching step.

16. A method according to claim 11 wherein said step (k) further includes an etching back process for forming said sacrificial layer in said capacitor area.

17. A method according to claim 11 wherein said step (l) is performed by a process selected from a group consisting of an etching process and a chemical-mechanical polishing process.

18. A method according to claim 11, wherein said step d) includes steps of:

d1) forming a silicide layer over said first conducting layer;

d2) defining a pattern of said bit line structure over said silicide layer; and d3) etching to form said bit line structure according to said pattern of said bit line structure.

19. A method according to claim 18 further including a step between said step d1) and said step d2) of:

d10) forming a fourth insulating layer over said silicide layer, and said method further including a step before said step e) of:

e0) forming a spacer around said bit line structure.

* * * * *